United States Patent [19]
Gersbach et al.

[11] Patent Number: 5,485,126
[45] Date of Patent: Jan. 16, 1996

[54] RING OSCILLATOR CIRCUIT HAVING OUTPUT WITH FIFTY PERCENT DUTY CYCLE

[75] Inventors: John E. Gersbach, Burlington; Masayuki Hayashi, Williston, both of Vt.

[73] Assignee: International Business Machines Corporation, Armonk, N.Y.

[21] Appl. No.: 186,742

[22] Filed: Jan. 25, 1994

[51] Int. Cl.[6] .................................................. H03B 1/00
[52] U.S. Cl. ........................... 331/57; 331/74; 331/75; 331/186; 327/175; 327/309; 327/317; 327/328
[58] Field of Search .......................... 331/57, 1 A, 186, 331/74, 75; 307/590, 591, 594, 603, 605, 597, 268, 443; 327/172, 175, 309, 317, 328, 288, 285, 262, 276, 281

[56] References Cited

U.S. PATENT DOCUMENTS

| | | | |
|---|---|---|---|
| 3,931,588 | 1/1976 | Gehweiler | 331/57 |
| 4,072,910 | 2/1978 | Dingwall et al. | 331/57 |
| 4,853,654 | 8/1989 | Sakurai | 331/57 |
| 4,891,609 | 1/1990 | Eilley | 331/57 |
| 4,908,528 | 3/1990 | Huang | 307/443 |
| 4,945,262 | 7/1990 | Piasecki | 307/451 |
| 5,061,907 | 10/1991 | Rasmussen | 331/57 |
| 5,072,197 | 12/1991 | Anderson | 331/57 |
| 5,081,428 | 1/1992 | Atriss et al. | 331/57 |
| 5,136,260 | 8/1992 | Yousefi-Elezei | 331/17 |
| 5,175,512 | 12/1992 | Self | 331/57 |
| 5,289,054 | 2/1994 | Lucas | 327/328 X |

FOREIGN PATENT DOCUMENTS 3-252216   11/1991   Japan.

OTHER PUBLICATIONS

"CMOS Ring Oscillator with Controlled Frequency," IBM Technical Disclosure, vol. 31, #2 Jul., 1988, pp. 154–156.

*Primary Examiner*—Robert J. Pascal
*Assistant Examiner*—Arnold Kinkead
*Attorney, Agent, or Firm*—Heslin & Rothenberg

[57] ABSTRACT

A ring oscillator circuit which provides an output signal having a substantially constant, fifty (50%) percent duty cycle. The circuit includes a plurality of cascaded inverting stages, each of which has an input circuit for detecting an output voltage of a preceding inverting stage. One inverting stage provides a voltage to an output node. A clamping circuit, coupled to the output node, provides current to the output node whenever the instantaneous voltage output at the output node departs from a threshold voltage of a subsequent logic circuit. The current is such as to clamp the average voltage output to the threshold voltage. The plurality of cascaded inverting stages is coupled to power supply voltage across capacitor configured transistors. The ring oscillator circuit can be employed within a voltage controlled oscillator.

19 Claims, 3 Drawing Sheets

RING OSCILLATOR CIRCUIT HAVING OUTPUT WITH FIFTY PERCENT DUTY CYCLE

TECHNICAL FIELD

This invention relates in general to oscillator circuits, and more particularly, to a ring oscillator circuit which provides an output signal having a substantially constant, fifty (50%) percent duty cycle.

BACKGROUND ART

Voltage controlled oscillators (VCOs) typically generate a frequency output based on an analog voltage input. Such oscillators are widely known in the art of integrated circuit manufacture. One particular implementation that has attained wide acceptance is known as the ring oscillator. By way of example, ring oscillators are described in U.S. Pat. Nos. 3,931,588; 4,072,910 and 4,891,609.

In a ring oscillator, the current output of each stage takes a finite time to charge or discharge the input capacitance of a following stage to its threshold voltage. The number of inverting stages is odd and the stages are cascaded in a loop so that at a certain frequency, a 180° phase shift is imparted to signals passing around the loop. Provided the loop gain is large enough, the signals become non-linear and square-wave oscillations are produced. Such oscillations can be used for a variety of applications. For example, a ring oscillator based VCO can be employed by a phase-locked loop (PLL) circuit. As is well known, PLL circuits provide an output signal that is substantially the same frequency and phase as an input reference signal.

Voltage controlled oscillators are designed to operate at a predetermined frequency based upon an applied control voltage at a VCO input, wherein a fifty percent duty cycle is conventionally derived from the VCO operating frequency. The fifty (50%) percent duty cycle clock is typically equal to one-half the operating frequency of the VCO and is generated by passing the output signal of the VCO through a divide by two logic block. Thus, in order to obtain a fifty percent duty cycle at, for example, 40 MHz, the VCO must operate at 80 MHz. Implementation of this conventional approach becomes more and more difficult as operating frequencies rise. Additionally, with this approach the frequency output and frequency gain factor of the VCO remain sensitive to process and temperature variations.

CMOS voltage controlled ring oscillators of the recent art have been designed with individual control of current at each delay stage of the oscillator ring. An output of one of the stages drives a CMOS logic gate which is usually an inverter with an input threshold equal to about one-half a power supply voltage $V_{DD}$. The voltage into the logic gate has an amplitude substantially less than this supply voltage. The signal typically does not have sharp edges, and its center point varies with process tolerances, supply voltage and operating temperature. Thus, the waveform at the output of one or more serial logic gates has steep edges, but a variable duty cycle.

Often it is desirable that a ring oscillator's output be symmetrical with a constant, fifty (50%) percent duty cycle. Hence, a need exists for a novel ring oscillator circuit that provides a high frequency symmetrical output waveform having a constant, fifty (50%) percent duty cycle. The oscillator circuit described herein satisfies this need.

DISCLOSURE OF INVENTION

Briefly summarized, in one aspect this invention comprises a ring oscillator circuit having a plurality of cascaded inverting stages. Each inverting stage has an input circuit for detecting an output voltage of a preceding inverting stage. At least one inverting stage provides a voltage to an output node. Clamping means is coupled to the output node for providing current to the output node whenever the instantaneous voltage at the node departs from a threshold voltage. The current is such as to clamp the average voltage at the output node to the threshold voltage. In one embodiment, the clamping means comprises a voltage divider connected to the output node and to a first voltage supply and a second voltage supply.

In another aspect, the invention comprises a compensation circuit for clamping average output voltage of a ring oscillator to a threshold voltage of a following logic circuit. The ring oscillator is of the type having an odd plurality of series-connected inverter stages. An output of a last inverter stage is coupled to an input of a first inverter stage. The last inverter stage provides output voltage to an output node. Each inverter stage is connected to a first common control point and a second common control point. The compensation circuit includes clamping means coupled to the output node for providing current to the output node whenever the instantaneous voltage at the node departs from the threshold voltage. The provided current tends to clamp the average voltage to the provided voltage. A first capacitor is connected between the first common control point and a first voltage supply, and a second capacitor is connected between the second common control point and a second voltage supply. When current flows at the output node due to the clamping means, the first capacitor and the second capacitor operate as current source and current sink as needed to maintain the average voltage substantially equal to the threshold voltage.

In still another aspect, a voltage controlled oscillator (VCO) is provided having a frequency output in response to a control voltage input. The VCO includes a voltage-to-current converter having an input connected to receive the control voltage. The voltage-to-current converter provides in response thereto a current control signal. A ring oscillator circuit is responsive to the current control signal. The oscillator circuit has a plurality of cascaded inverting stages, with each inverting stage comprising an input circuit for detecting an output voltage of a preceding inverting stage. At least one inverting stage provides voltage to an output node. The ring oscillator circuit further has a clamping means coupled to the output node for providing current to the output node whenever the instantaneous voltage of the output node departs from a threshold voltage of a subsequent logic circuit. The current is such as to clamp the average voltage to the threshold voltage. Enhancements on this basic embodiment, as well as for the other aspects of the invention, are also described and claimed.

A ring oscillator circuit in accordance with the invention provides an output signal with a substantially constant, fifty (50%) percent duty cycle. Specifically, by maintaining the average output voltage at approximately the threshold voltage of the output buffer connected to the plurality of cascaded inverting stages, the signal output from the buffer is guaranteed to have the desired fifty (50%) percent duty cycle. The clamping mechanism connected to the output node of the cascaded inverting stages ensures that the average voltage at the output node remains clamped to the buffer's threshold voltage notwithstanding process tolerances, or supply voltage or operating temperature variations. Thus, a fifty (50%) percent duty cycle is obtained without operating the cascaded inverting stages at double the desired frequency.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Figure 1:
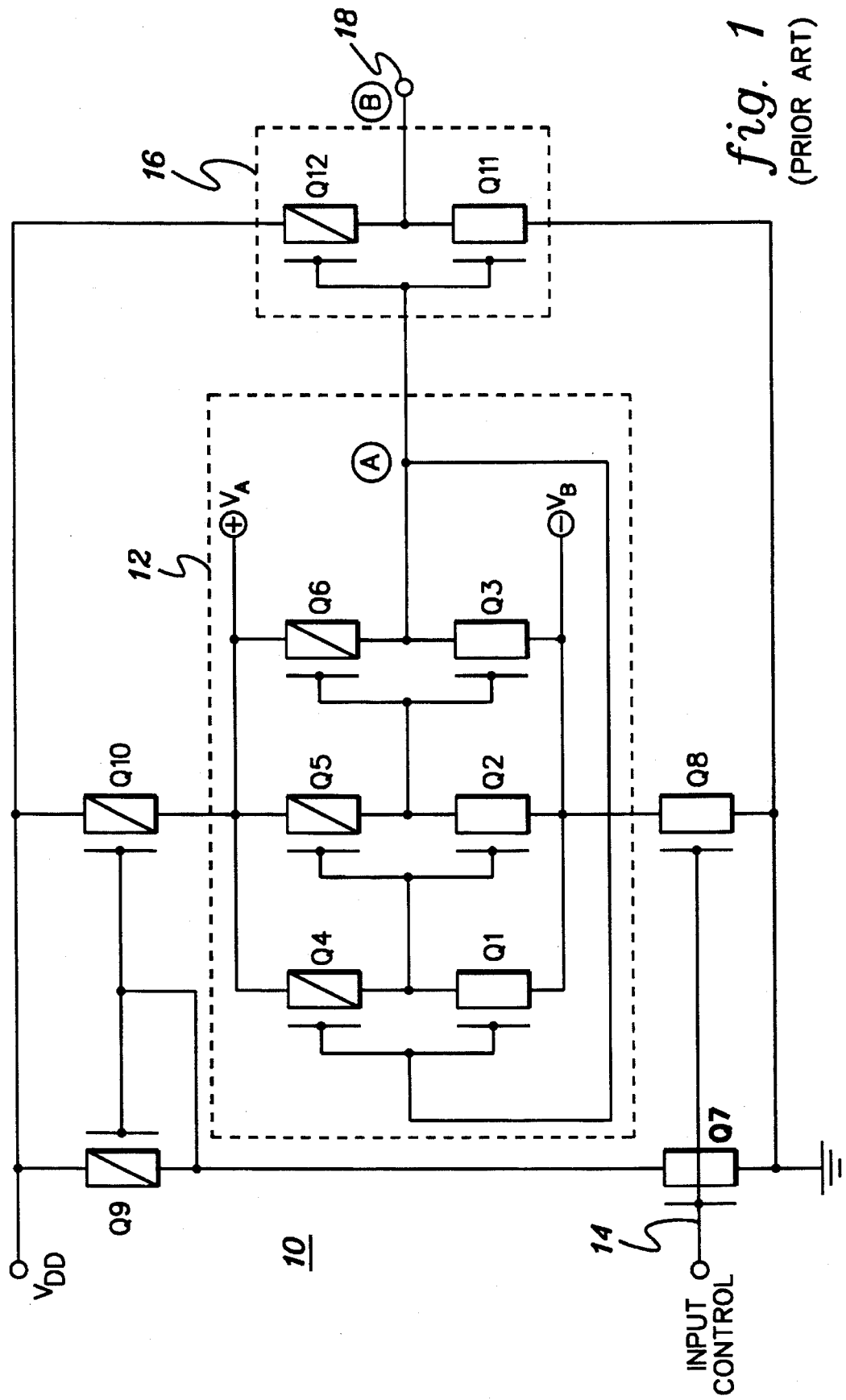
FIG. 1 is a schematic of a conventional ring oscillator circuit.

Refer now to the drawings wherein the same reference characters are used throughout different figures to designate the same or similar components. The accompanying schematics include complementary metal oxide semiconductor (CMOS) circuits with P-channel field-effect transistors (PFETs), each indicated in the drawings by a rectangle with a diagonal line formed therein and a control element or gate electrode arranged adjacent thereto, and with N-channel field-effect transistors (NFETs), each indicated by a rectangle without a diagonal line and with a control element or gate electrode arranged adjacent thereto.

FIG. 1 depicts a conventional voltage controlled oscillator (VCO) circuit 10. This circuit is described in detail in U.S. Pat. No. 4,072,910, entitled "Voltage Controlled Oscillator Having Equally Controlled Current Source and Current Sink." Briefly described, VCO circuit 10 includes three complementary inverters Q1/Q4, Q2/Q5, and Q3/Q6 interconnected to form a ring oscillator 12. A PFET Q10 is connected to function as a controlled current source, while NFET Q8 is connected to function as a controlled current sink.

Circuitry responsive to an input control signal at terminal 14 is also provided for controlling the currents delivered by current source Q10 and demanded by current sink Q8 such that the source and sink tend to track each other over a range of variation. This function is provided by NFET Q7 connected as a common-source amplifier, with self-biased PFET Q9 as a drain load, by the paralleling of the source-to-gate circuits of Q7 & Q8, and by the paralleling of the source-to-gate circuits of PFETs Q9 & Q10. Tracking of the source and sink currents such that they are maintained substantially equal over a range of adjustment is important to providing a VCO with a monotonic frequency versus input control signal characteristic.

The three complementary inverters of ring oscillator 12 oscillate at a rate determined by the capacitance at the input and output of each inverter, the potentials across the inverters ($V_A$–$V_B$), the currents flowing through the inverting stages (since the stage currents determine the rate at which nodal capacitances can be charged or discharged), the open loop gain, and the frequency response of the transistors forming the inverters. When the quiescent voltage of each stage of the ring oscillator is approximately midway between supply voltage $V_{DD}$ and ground, a maximum signal swing is enabled and the output of any inverter of the oscillator may be directly connected to an output buffer 16 which operates directly between supply voltage $V_{DD}$ and ground (GND). Buffer 16, which comprises NFET Q11 and PFET Q12, provides VCO circuit output at terminal 18.

For a more detailed discussion of FIG. 1, reference should be made to U.S. Pat. No. 4,072,910. As with many conventional ring oscillator circuits, the oscillator circuit of FIG. 1 relies on selection of identical complementary inverters in order to provide a symmetric drive to output buffer 16. As noted, however, the output signal from this ring oscillator circuit can vary with process tolerances, and with supply voltage and operating temperature variations. This in turn results in a non-symmetrical waveform with a variable duty cycle.

Figure 2A:
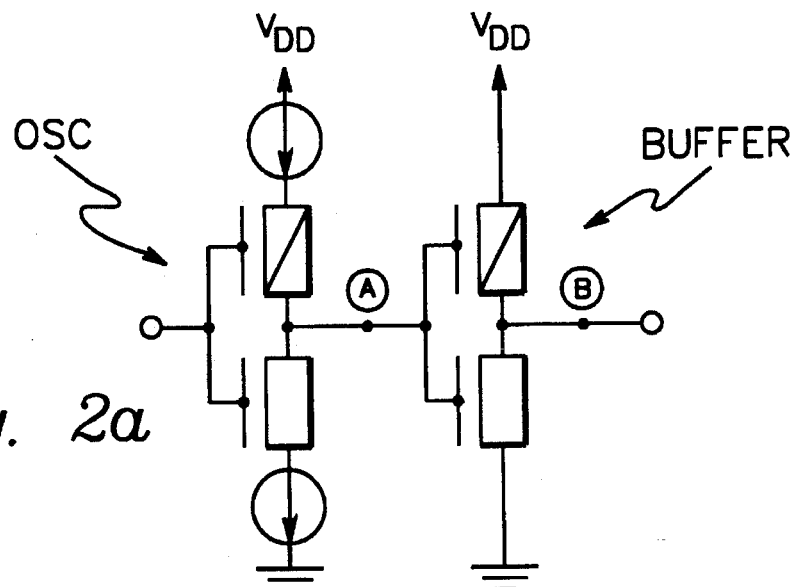
FIG. 2a is a partial schematic showing a ring oscillator inverter stage connected through an output node to output buffer logic.
Figure 2B:
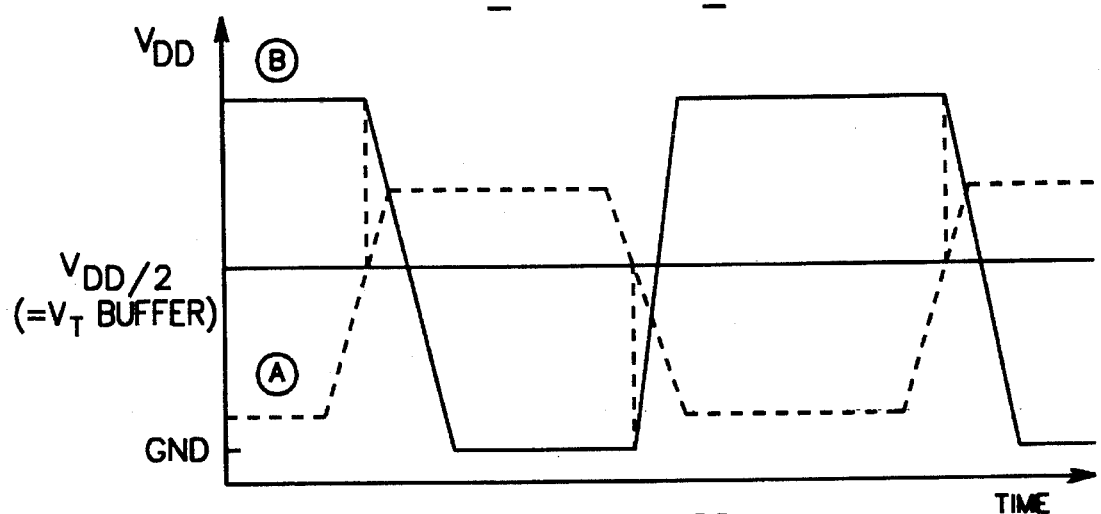
FIG. 2b graphically depicts for the circuit of FIG. 2a voltage vs. time for a constant signal at node A, notwithstanding a threshold voltage $V_T$ change at the output buffer logic, and the resultant signal at node B.

FIG. 2a is a partial schematic of FIG. 1 showing the rightmost ring oscillator inverter stage connected through node A to the output buffer logic, which provides an output signal at node B. By way of example, FIG. 2b depicts an output signal at node B which results from a shift in voltage supply $V_{DD}$. This voltage shift results in a change in the threshold voltage $V_T$ to the buffer. With the oscillator circuit implementation of FIG. 2a, the voltage signal at node A remains substantially unchanged. Thus, the voltage at node A deviates from the buffer threshold voltage $V_T$. Because of this deviation, the resultant signal at node B no longer retains a fifty-fifty duty cycle.

Figure 2C:
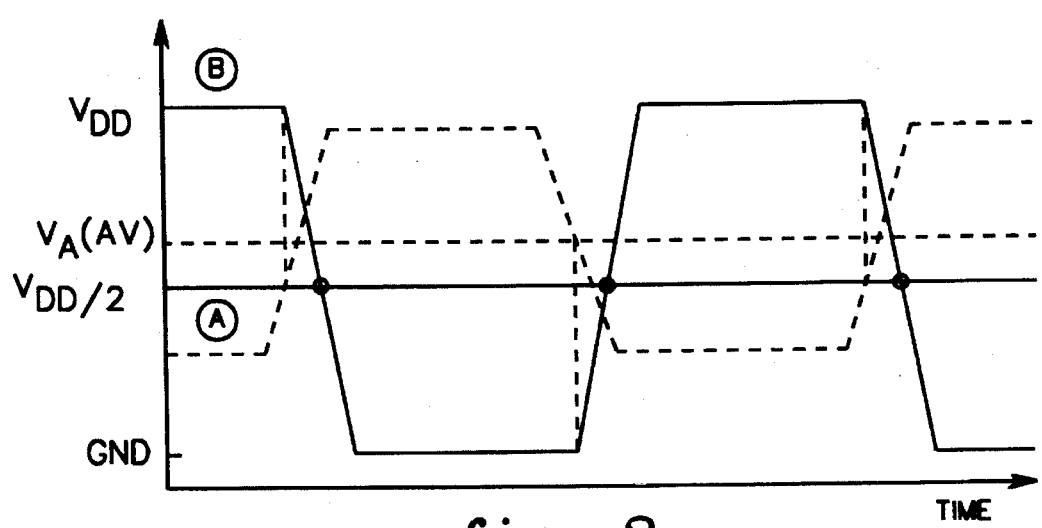
FIG. 2c graphically depicts for a ring oscillator circuit in accordance with the invention voltage vs. time for a signal at node A shifted to correspond to a threshold voltage $V_T$ change at the output buffer logic, and the resultant signal at node B with fifty (50%) percent duty cycle.

Pursuant to the invention, the average voltage at node A is clamped to the threshold voltage $V_T$ of the buffer such that the buffer's output will necessarily be symmetric about the center of its range. Thus, shown in FIG. 2c, a shift in the threshold voltage $V_T$ results in a commensurate shift in the average voltage signal at node A. Due to this tracking of the voltage at node A with the buffer's threshold voltage, the output of the buffer will retain the desired fifty (50%) percent duty cycle.

Generally stated, this invention provides a voltage clamping circuit coupled to the output node of the ring oscillator for providing current to the output node whenever its instantaneous voltage departs from the threshold voltage of the subsequent logic circuit. The provided current is such as to clamp the average voltage to this threshold voltage ($V_T$) notwithstanding changes in the threshold voltage.

Figure 3:
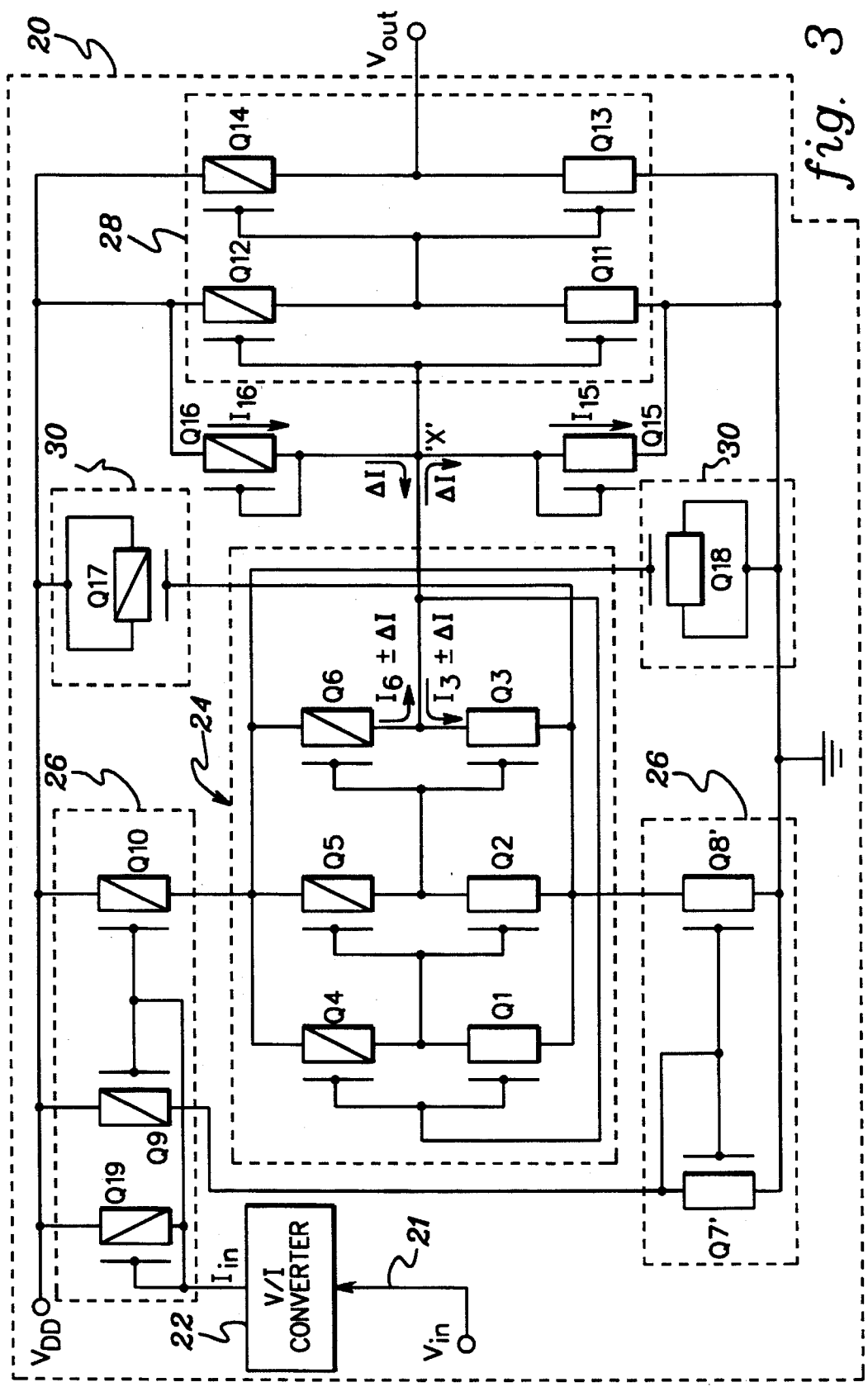
FIG. 3 is a schematic of one embodiment of a ring oscillator circuit in accordance with the invention.

FIG. 3 presents one embodiment of a ring oscillator circuit in accordance with the invention, shown within a voltage controlled oscillator circuit 20. Voltage controlled oscillator (VCO) circuit 20 comprises six principal components; namely, a voltage-to-current converter 22; a three-stage inverter loop 24; a control circuit 26, to vary power applied to loop 24 and thereby change its operating frequency; an output buffer 28, consisting of two logic stages; a voltage divider Q15 & Q16; and an AC decoupler 30 comprising Q17 & Q18.

A control voltage $V_{in}$ is received at terminal 21 as an input to V/I converter 22. The control voltage is converted into a control current, which is fed to the gate electrodes of PFETs Q9, Q19 & Q10 of control circuit 26. The source electrodes of PFETs Q9, Q19 & Q10 are tied to power supply voltage $V_{DD}$. The drain electrode of PFET Q9 is commonly connected to the drain electrode of NFET Q7' and feeds the gate electrodes of NFET Q7' and Q8' of control circuit 26. The drain electrode of PFET Q19 is connected to receive the control current $I_{in}$. The source electrodes of NFETs Q7' and Q8' are tied to ground potential (GND). The drain electrode of PFET Q10 and the drain electrode of NFET Q8' are connected in common to each of the complementary pairs of inverters Q1/Q4, Q2/Q5 and Q3/Q6 of ring oscillator 24.

As noted, oscillator 24 comprises a three-stage inverter loop, such as that described in U.S. Pat. No. 4,072,910. Although oscillator 24 may employ additional inverter stages, an odd number of stages is required to attain an output 180° out-of-phase from the input. Oscillator ring 24 output is taken at node 'X' which is also the input node to output buffer 28.

In accordance with the invention, a voltage divider connected to node 'X' operates as a voltage clamp. The divider is connected between voltage supply $V_{DD}$ and ground (GND). PFET Q16 is connected in diode configuration with its source electrode tied to power supply voltage $V_{DD}$ and its gate and drain electrodes connected to node 'X' while NFET Q15 is connected in diode configuration with its source electrode connected to ground (GND) and its gate and drain electrodes connected to node 'X'.

The transistors of the voltage divider are ratioed to approximate the size of the transistors of output buffer 28, i.e., NFETs Q11 & Q13 and PFETs Q12 & Q14. These diodes provide an AC load on the output node of the oscillator loop and act as a reference to the threshold voltage $V_T$ of the output buffer, which is approximately one-half the supply voltage $V_{DD}$. This tends to appropriately charge or discharge the capacitors at the control terminals to bring the node back to the buffer's threshold voltage $V_T$. As a result, the amount of time that the clock signal spends above $V_T$ tends to be equal to the amount of time that the signal spends below $V_T$. Thus, the output duty cycle remains at approximately fifty percent. As an alternate embodiment, two equally sized PFET diodes could be employed as the voltage divider. Again, the divider transistors must be sized to provide sufficient current to keep the output voltage at node 'X' centered about the logic threshold $V_T$ of output buffer 28.

By ratioing the voltage divider transistors the same as the buffer transistors, the voltage divider will track dimensional changes in the buffer transistors. Thus, when the threshold voltage of output buffer 28 varies, the voltage divider will generate an appropriate current to vary the voltage at node 'X' by a corresponding amount such that the voltage at node 'X' remains centered around the threshold voltage of the output buffer.

The positive and negative power terminals of the inverters in the inverter loop 24 are common so that they all have the same supply voltage. This will tend to maintain the inverter delay of all stages substantially equal. The inverter power terminals are AC decoupled by two capacitor configured transistors to provide a quiet power supply voltage to the oscillator. In the embodiment depicted, AC decoupler 30 consists of a PFET Q17 and an NFET Q18, each of which has its source and drain electrodes commonly connected. The gate electrode of PFET Q17 is connected to the drain electrode of NFET Q8', while the gate electrode of NFET Q18 is tied to the drain electrode of PFET Q10.

It will be observed from the above discussion that a ring oscillator circuit in accordance with the invention provides an output signal with a substantially constant fifty (50%) percent duty cycle. Specifically, by maintaining the output voltage at approximately the threshold voltage $V_T$ of the output buffer connected to the plurality of cascaded inverting stages, the signal output from the buffer is guaranteed to have the desired fifty (50%) percent duty cycle. The clamping mechanism connected to the output node of the cascaded inverting stages ensures that the average voltage at the output node remains clamped to the buffer's threshold voltage notwithstanding process tolerances, or supply voltage or operating temperature variations. Thus, a fifty (50%) percent duty cycle is obtained without operating the cascaded inverting stages at double the desired frequency.

Although a specific embodiment of the present invention has been illustrated in the accompanying drawings and described in the foregoing detailed description, it will be understood that the invention is not limited to the particular embodiment described herein, but is capable of numerous rearrangements, modifications and substitutions without departing from the scope of the invention. The following claims are intended to encompass all such modifications.

We claim:

1. A compensation circuit for clamping an average output voltage of a ring oscillator to a threshold voltage of a subsequent logic circuit, the ring oscillator being of the type having an odd plurality of series-connected inverter stages, wherein an output of a last inverter stage is coupled to an input of a first inverter stage, the last inverter stage providing voltage to an output node, each inverter stage being connected to a first common control point and to a second common control point, the compensation circuit comprising:

clamping means coupled to said output node for providing current to said output node whenever the voltage at said output node departs from the threshold voltage, said current tending to clamp the average output voltage to the threshold voltage, said clamping means comprising a voltage divider connected to said output node for maintaining the average output voltage at said output node at said threshold voltage;

a first capacitor connected between said first common control point and a first voltage supply; and a second capacitor connected between said second common control point and a second power supply voltage.

2. The compensation circuit of claim 1, wherein the threshold voltage varies within a range of voltages.

3. The compensation circuit of claim 1, wherein said voltage divider comprises an NFET connected between said first voltage supply and the output node, and a PFET connected between said second voltage supply and the output node.

4. The compensation circuit of claim 1, wherein said first capacitor comprises an NFET having a gate electrode connected to the first common control point and a source electrode and a drain electrode connected to the first voltage supply, and wherein said second capacitor comprises a PFET having a gate electrode connected to the second common control point and a source electrode and a drain electrode connected to the second voltage supply.

5. The compensation circuit of claim 4, wherein the first voltage supply provides a ground potential (GND) and the second voltage supply provides a voltage $V_{DD}$, wherein $V_{DD}$>GND.

6. The compensation circuit of claim 1, wherein the ring oscillator includes an output buffer means having an input node connected to the output node of the odd plurality of series-connected inverter stages, and wherein the threshold voltage maintained by said clamping means comprises a threshold switching voltage of the output buffer means.

7. A ring oscillator circuit comprising:

a plurality of cascaded inverting stages, each inverting stage comprising an input circuit for detecting an output voltage of a preceding inverting stage, at least one inverting stage providing voltage to an output node; and clamping means coupled to said output node for providing current to said output node whenever the voltage at said output node departs from a threshold voltage, said current tending to clamp an average of the voltage at said output node to said threshold voltage, said clamping means including a voltage divider connected to said output node for maintaining the average voltage at said output node at said threshold voltage.

8. The ring oscillator circuit of claim 7, further comprising:

a first control port connected in common to each inverting stage of said plurality of cascaded inverting stages and a second control port connected in common to each inverting stage of said plurality of cascaded inverting stages; and a first capacitor connected between the first control port and a first voltage supply and a second capacitor connected between the second control port and a second voltage supply.

9. The ring oscillator circuit of claim 8, wherein said first capacitor comprises an NFET having a gate electrode tied to said first control port and a source electrode and a drain electrode connected to said first voltage supply, and wherein said second capacitor comprises a PFET having a gate electrode connected to the second control port and a source electrode and a drain electrode connected to the second voltage supply.

10. The ring oscillator circuit of claim 8, wherein said voltage divider comprises an NFET connected between said output node and a first voltage supply and a PFET connected between said output node and a second voltage supply.

11. The ring oscillator circuit of claim 10, wherein the first voltage supply comprises ground potential (GND) and the second voltage supply comprises $V_{DD}$ voltage supply.

12. A voltage controlled oscillator providing a frequency output in response to an input control voltage, said voltage controlled oscillator comprising:

a voltage-to-current converter having an input connected to receive the input control voltage, said voltage-to-current converter providing in response thereto a current control signal; and a ring oscillator circuit coupled to the voltage-to-current converter to receive the current control signal, said ring oscillator having a plurality of cascaded inverting stages, each inverting stage comprising an input circuit for detecting an output voltage of a preceding inverting stage, at least one inverting stage providing a voltage to an output node, and said ring oscillator circuit further having clamping means coupled to the output node for providing current to the output node whenever the voltage at the output node departs from a threshold voltage, said current tending to clamp an average of the voltage at the output node to said threshold voltage, said clamping means including a voltage divider connected to said output node for maintaining the average voltage at said output node at said threshold voltage.

13. The voltage controlled oscillator of claim 13, wherein said voltage divider comprises an NFET connected between said output node and a first voltage supply and a PFET connected between said output node and a second voltage supply.

14. The voltage controlled oscillator of claim 12, further comprising:

a first control port connected in common to each inverting stage of said plurality of cascaded inverting stages, and a second control port connected in common to each inverting stage of said plurality of cascaded inverting stages; and a first capacitor connected between the first control port and a first voltage supply and a second capacitor connected between the second control port and a second voltage supply.

15. The voltage controlled oscillator of claim 14, wherein said first capacitor comprises an NFET having a gate electrode tied to said first control port and a source electrode and a drain electrode connected to said first voltage supply, and wherein said second capacitor comprises a PFET having a gate electrode connected to the second control port and a source electrode and a drain electrode connected to the second voltage supply.

16. The voltage controlled oscillator of claim 12, wherein said ring oscillator circuit further comprises an output buffer means having an input node connected to said output node, and wherein said threshold voltage comprises a threshold switching voltage of said output buffer means.

17. The ring oscillator circuit of claim 7, wherein the threshold voltage varies within a range of voltages.

18. The ring oscillator circuit of claim 7, further comprising an output buffer means having an input node connected to said output node, and wherein said threshold voltage comprises a threshold switching voltage of said output buffer means.

19. The ring oscillator circuit of claim 18, wherein said output buffer means comprises two serially connected output buffers, and wherein the input node of said output buffer means is connected to a first output buffer of said two serially connected output buffers and a second output buffer of said two serially connected output buffers provides an output signal.

* * * * *